(12) United States Patent
Göötz et al.

(10) Patent No.: US 11,804,579 B2
(45) Date of Patent: Oct. 31, 2023

(54) OPTOELECTRONIC SEMICONDUCTOR DEVICE AND METHOD FOR MANUFACTURING AN OPTOELECTRONIC SEMICONDUCTOR DEVICE

(71) Applicant: OSRAM OLED GMBH, Regensburg (DE)

(72) Inventors: Britta Göötz, Regensburg (DE); Norwin von Malm, Nittendorf (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 17/689,498

(22) Filed: Mar. 8, 2022

(65) Prior Publication Data

US 2022/0199868 A1    Jun. 23, 2022

Related U.S. Application Data

(62) Division of application No. 16/413,490, filed on May 15, 2019, now Pat. No. 11,309,461.

(30) Foreign Application Priority Data

May 15, 2018 (DE) .................... 102018111595.4

(51) Int. Cl.
*H01L 33/50* (2010.01)
*H01L 33/60* (2010.01)
*H01L 27/15* (2006.01)

(52) U.S. Cl.
CPC .......... *H01L 33/504* (2013.01); *H01L 27/156* (2013.01); *H01L 33/60* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| | | | |
|---|---|---|---|
| 2014/0168572 A1 | 6/2014 | Iwata et al. | |
| 2017/0133561 A1 | 5/2017 | von Malm | |
| 2017/0250316 A1 | 8/2017 | Yeon et al. | |
| 2019/0094623 A1 | 3/2019 | Chang et al. | |
| 2019/0198730 A1 | 6/2019 | Pickett et al. | |
| 2019/0326349 A1 | 10/2019 | Kwon et al. | |

FOREIGN PATENT DOCUMENTS

| | | | |
|---|---|---|---|
| DE | 102012110957 A1 | 5/2014 | |
| DE | 102014108282 A1 | 12/2015 | |
| WO | WO-2009112573 A2 * | 9/2009 | ......... C23C 18/1641 |

* cited by examiner

*Primary Examiner* — Robert K Carpenter
(74) *Attorney, Agent, or Firm* — Slater Matsil, LLP (57) ABSTRACT

In an embodiment a method for manufacturing an optoelectronic semiconductor device includes providing a semiconductor body having an active region configured to generate electromagnetic radiation and a coupling-out surface along a main radiation direction, forming a mask layer having a plurality of recesses on the coupling-out surface on the semiconductor body, depositing metallic separators in the recesses and applying a wavelength conversion element to the coupling-out surface of the semiconductor body such that the metallic separators are at least partially embedded therein.

14 Claims, 6 Drawing Sheets

OPTOELECTRONIC SEMICONDUCTOR DEVICE AND METHOD FOR MANUFACTURING AN OPTOELECTRONIC SEMICONDUCTOR DEVICE

CROSS-REFERENCE TO RELATED APPLICATIONS

This is a divisional application of U.S. application Ser. No. 16/413,490, entitled "Optoelectronic Semiconductor Device and Method for Manufacturing an Optoelectronic Semiconductor Device," filed on May 15, 2019, which claims the priority of German patent application 102018111595.4, filed on May 15, 2018, all of which are incorporated herein by reference in its entirety.

TECHNICAL FIELD

An optoelectronic semiconductor device and a method for manufacturing an optoelectronic semiconductor device are provided. An optoelectronic semiconductor device can be a radiation-emitting optoelectronic semiconductor device that emits electromagnetic radiation, such as light, during operation.

SUMMARY

Embodiments provide an optoelectronic semiconductor device, which has improved optical properties.

Further embodiments provide a method for manufacturing an optoelectronic semiconductor device that enables a simplified manufacturing.

According to at least one embodiment of the optoelectronic semiconductor device, the optoelectronic semiconductor device comprises a semiconductor body having, along a main radiation direction, an active region designed to generate electromagnetic radiation, a plurality of independently controllable emission regions, and a coupling-out surface. The active region preferably extends across the main radiation direction of the semiconductor body and comprises a pn junction, preferably a double heterostructure, a single quantum well structure (SQW) or, particularly preferred, a multiple quantum well structure (MQW) for radiation generation. The semiconductor body is preferably grown epitaxially on a growth substrate.

The optoelectronic semiconductor device preferably comprises a single epitaxially grown semiconductor body. Furthermore, the semiconductor body preferably includes all emission regions. In particular, the optoelectronic semiconductor device is a pixelated emitter.

The main radiation direction is the direction in which most of the electromagnetic radiation emitted by the semiconductor body is radiated.

The coupling-out surface of the semiconductor body, through which at least a part of the electromagnetic radiation generated in the active region is coupled out, is accordingly arranged transversely, preferably perpendicular to the main radiation direction. Furthermore, with respect to a main extension plane of the semiconductor body, the main radiation direction is arranged transversely, preferably perpendicularly to this main extension plane, so that, in other words, the coupling-out surface and the main extension plane of the semiconductor body are preferably aligned parallel to each other.

According to at least one embodiment of the optoelectronic semiconductor device, the optoelectronic semiconductor device comprises a wavelength conversion element which has conversion regions, optically separated from each other by means of metallic separators, and which is arranged downstream of the semiconductor body in the main radiation direction of the active region. The wavelength conversion element converts radiation, generated by the active region, at least partially into radiation of a different wavelength.

The wavelength conversion element is preferably formed with a matrix material, such as a polymer, for example, silicone, epoxy or a hybrid material containing silicone, epoxy and/or a further polymer, which is filled with particles of a converter material. Other advantageous materials for the matrix material include inorganic sol-gel materials such as silicon oxide, titanium oxide, zinc oxide, aluminum oxide, hafnium oxide or zirconium oxide. Furthermore, the wavelength conversion element can also be designed as a ceramic wavelength conversion element, preferably with a ceramic matrix material filled with particles of a converter material.

Ceramic particles, fluorescent organic molecules/polymers or quantum dots are particularly suitable as converter materials. A quantum dot is a structure in which charge carriers are so restricted in their mobility in all three spatial directions that their energy can only reach discrete values. Quantum dots absorb electromagnetic radiation and reemit it in a desired spectral range.

The diameter of the particles of the converter material is preferably as small as possible. The D50 diameter of the converter particles is preferably in a range between 20 µm and 0.5 µm and particularly preferably in a range between 1 µm and 5 µm. The D50 diameter is the mean particle size. In other words D50 diameter means that 50% of the particles are smaller than the specified value.

Optical separation is generally achieved by an absorbing or reflecting layer between two adjacent light sources. Optically separated conversion regions are formed by metallic separators arranged between the respective conversion regions. Optical separation is particularly advantageous for increasing the contrast ratio of adjacent conversion regions.

According to at least one embodiment of the optoelectronic semiconductor device, the emission regions are at least partially aligned with the conversion regions and explicitly assigned to the conversion regions. In other words, at least some of the emission regions, preferably a plurality of emission regions or even all emission regions, are oriented towards corresponding conversion regions and explicitly assigned.

According to at least one embodiment, the optoelectronic semiconductor device comprises a semiconductor body having, along a main radiation direction, an active region adapted to generate electromagnetic radiation and having a plurality of independently controllable emission regions, and a coupling-out surface, a wavelength conversion element which has conversion regions optically separated from each other by means of metallic separators and which is arranged downstream of the semiconductor body in the main radiation direction of the active region, wherein the emission regions are at least partially aligned with the conversion regions and explicitly assigned to the conversion regions.

An optoelectronic semiconductor device described here is based, among other things, on the following considerations: For the production of a pixelated optoelectronic semiconductor device, i.e., a semiconductor device with a plurality of independently controllable emission regions, a high contrast between the individual emission and conversion regions is desirable. In a downstream wavelength conversion element, for example, wave conduction and scattering within the wavelength conversion element can cause optical crosstalk between adjacent conversion regions. The crosstalk between the conversion regions causes a deterioration of the contrast.

The optoelectronic semiconductor device described here makes use, among other things, of the idea of using an optical isolation of the individual conversion regions in order to obtain an optoelectronic semiconductor device with improved contrast. This is done, for example, by introducing metallic separators into the wavelength conversion element, for example, in the form of recesses filled with a metallic and preferably reflective material.

According to at least one embodiment of the optoelectronic semiconductor device, each emission region is assigned exactly one conversion region.

According to at least one embodiment of the optoelectronic semiconductor device, different converter materials are arranged in different conversion regions. This means that different converter materials are arranged in different conversion regions from each other, which differ in particular in the wavelength of the converted radiation. For example, an RGB unit can be produced, i.e., a unit with a converter material suitable for the emission of red, green and blue radiation, which are arranged next to each other and can therefore emit any mixed color of the three converter materials used. Furthermore, individual conversion regions can also be empty or filled with transparent material, so that the electromagnetic radiation generated in the active region is transmitted unchanged.

According to at least one embodiment of the optoelectronic semiconductor device, the emission regions and the conversion regions have an extension in a direction transverse to the main radiation direction in a range from 200 μm to 300 μm, preferably from 100 μm to 150 μm and particularly preferably from 30 μm to 50 μm. A smaller extension of the emission and conversion regions allows a higher resolution. In particular, the emission regions and the conversion regions are square.

According to at least one embodiment of the optoelectronic semiconductor device, the wavelength conversion element has an extension in the main radiation direction in a range of 5 μm to 20 μm. A larger extension of the wavelength conversion element in the main radiation direction advantageously increases the degree of conversion of the emitted electromagnetic radiation.

According to at least one embodiment of the optoelectronic semiconductor device, the metallic separators form a grid that divides the wavelength conversion element into the conversion regions. The grid has grid cells that correspond to the conversion regions. The metallic grid can be formed, for example, with gold, silver, aluminum, nickel, platinum, palladium, copper or molybdenum. Preferably, the metallic grid has a high reflectivity for the electromagnetic radiation generated in the optoelectronic semiconductor device. The electromagnetic radiation generated in the optoelectronic semiconductor device includes both the electromagnetic radiation emitted directly from the active region of the semiconductor body and the radiation converted and reemitted in the wavelength conversion element.

According to at least one embodiment of the optoelectronic semiconductor component, the semiconductor body is divided into the emission regions by means of an insulating grid embedded within the semiconductor body. This insulating grid embedded in the semiconductor body serves to electrically isolate and/or optically isolate the emission regions from each other. Neighboring emission regions can thus be advantageously controlled separately from each other. Furthermore, the contrast between adjacent emission regions is increased.

According to at least one embodiment of the optoelectronic semiconductor device, the metallic separators completely penetrate the wavelength conversion element on the side facing away from the semiconductor body. Complete penetration of the metallic separators greatly reduces crosstalk to adjacent conversion regions and thus increases the contrast between adjacent conversion regions.

According to at least one embodiment of the optoelectronic semiconductor device, the metallic separators have a reflective layer. A reflective layer on the surface of the metallic separators advantageously increases their reflectivity and consequently the radiation yield of the optoelectronic semiconductor device. Furthermore, the use of other metals with good deposition properties but with lower reflectivity than the basic structure of the optical separators is possible. The reflective layer can be formed in particular with silver. Preferably, the reflective layer can be designed as a multilayer layer stack comprising a plurality of dielectric layers. For example, the dielectric layers are deposited as ALD layers and formed with a dielectric such as aluminum oxide and/or niobium oxide.

ALD layers (ALD: Atomic Layer Deposition) can be produced using an ALD deposition process in which a monolayer of atoms is deposited. The deposition of a monolayer can be achieved by deposition of several sub-monolayers, for example, by means of an organometallic precursor such as trimetylaluminum. The methyl groups prevent a complete monolayer by "steric hindrance" of the individual ligands and thus initially form a sub-monolayer. This cycle can be repeated several times until a monolayer is formed from several sub-monolayers. Thus, no atomic layers stacked on top of each other are formed, but only a monatomic layer is deposited on a surface. The advantage of such a monolayer deposition is a very good coverage of the surface and the overmolding of even the smallest particles and unevenness. This results in a very dense layer, which can advantageously provide a good diffusion barrier.

According to at least one embodiment of the optoelectronic semiconductor device, the reflective layer of the metallic separators is a dielectric mirror with a multilayer structure. A dielectric mirror is a sequence of several dielectric layers with a defined optical thickness and different refractive indices. Due to the jumps in refractive index at the interfaces of the different materials, the layer stack acts as a reflective layer for a wavelength for which the selected optical layer thicknesses result in constructive interference.

A method for manufacturing an optoelectronic semiconductor device is also provided. In particular, a semiconductor device described here can be manufactured using this method. This means that all features disclosed for the semiconductor device are also disclosed for the method and vice versa.

According to at least one embodiment of a method for manufacturing an optoelectronic semiconductor device, the method comprises the following steps: Providing a semiconductor body comprising along a main radiation direction, an active region designed to generate electromagnetic radiation, and a coupling-out surface. The regions of the semiconductor body are particularly grown epitaxially.

According to at least one embodiment of the method, a mask layer is formed with a plurality of recesses on the coupling-outsurface of the semiconductor body. The mask layer can either be made of a photoresist or, in particular, a dry resist. A dry resist has the advantage that it can have a greater layer thickness and thus a thicker mask layer can be produced. A thicker mask layer makes it possible to produce structures with larger dimensions in the direction of the main radiation direction.

According to at least one embodiment of the method, metallic separators are deposited in the recesses. The height of the metallic separators is limited by the extension of the mask layer in the direction of the main radiation direction.

According to at least one embodiment of the method, a wavelength conversion element is applied to the coupling-out surface of the semiconductor body by means of dispensing, jetting, spraying, doctoring, stamping or other printing processes. The wavelength conversion element is applied in such a way that the wavelength conversion element is divided into a number of conversion regions by the metallic separators embedded in it. The metallic separators are at least partially embedded in the wavelength conversion element. In other words, the metallic separators are at least partially overmolded by the wavelength conversion element.

According to at least one embodiment of the method for manufacturing an optoelectronic semiconductor device, an adhesive layer is applied between the semiconductor body and the metallic separators. The adhesive layer serves to improve the adhesion of the metallic separators to the semiconductor body and may in particular contain the same metal or material as the metallic separators.

According to at least one embodiment of the method for manufacturing an optoelectronic semiconductor device, the adhesive layer is removed from the metallic separators after deposition. The removal of the adhesive layer avoids disturbing reflections on the adhesive layer within the conversion regions.

According to at least one embodiment of the method for manufacturing an optoelectronic semiconductor device, the recesses completely penetrate the mask layer starting from the side of the mask layer facing away from the semiconductor body and are aligned with the emission regions of the semiconductor body.

According to at least one embodiment of the method for manufacturing an optoelectronic semiconductor device, the metallic separators form a grid that divides the wavelength conversion element into the conversion regions.

According to at least one embodiment of the method for manufacturing an optoelectronic semiconductor device, the mask layer is removed after the deposition of metallic separators in the recesses. If the mask layer is not transparent, the removal of the mask layer advantageously prevents absorption or reflection of light at the mask layer.

According to at least one embodiment of the method for manufacturing an optoelectronic semiconductor device, the metal separators are deposited galvanically. Galvanic deposition enables high deposition rates and an advantageously high aspect ratio of the structures produced. A high aspect ratio is advantageous in the manufacture of metallic separators as it allows the production of slim structures with a large extension in the main radiation direction. A large extension in the main radiation direction allows an advantageously high optical separation of adjacent conversion regions and a small lateral dimension advantageously reduces the required region of the metallic separators. The adhesive layer can serve as an electrical contact during galvanic deposition and at the same time improve the adhesion of the galvanically deposited material to the semiconductor body.

According to at least one embodiment of the method for manufacturing an optoelectronic semiconductor device, a reflective layer is deposited on the metallic separators electroless. An electroless deposition process comprises in particular an ion exchange process or a reductive deposition by autocatalysis. The reflective layer can, for example, be formed with a metal such as silver, gold, nickel, aluminum or copper. The reflective layer advantageously increases the reflectivity of the metallic separators for the electromagnetic radiation generated in the optoelectronic semiconductor device.

According to at least one embodiment of the method for manufacturing an optoelectronic semiconductor device, material of the conversion layer is removed from the side of the metallic separators facing away from the semiconductor body. When the conversion material is introduced into the grid of the metallic separators, for example, residues of the conversion material may adhere to the top of the metallic separators. These residues can deteriorate the contrast between adjacent conversion regions. The excess conversion material can be removed by etching, grinding, polishing or ultrasonic treatment. The ablation rate of the conversion materials is advantageously higher than or equal to the ablation rate of the metal of the metallic separators. This prevents excessive removal of the metallic separators.

BRIEF DESCRIPTION OF THE DRAWINGS

Further advantages and advantageous embodiments and further designs of the optoelectronic semiconductor device result from the following exemplary embodiments in connection with the figures.

Showing in.

Same, similar or seemingly similar elements are provided in the figures with the same reference signs. The figures and the proportions of the elements depicted in the figures are not to be regarded as true to scale. Rather, individual elements may be exaggeratedly large for better representability and/or better comprehensibility.

DETAILED DESCRIPTION OF ILLUSTRATIVE EMBODIMENTS

Figure 1:
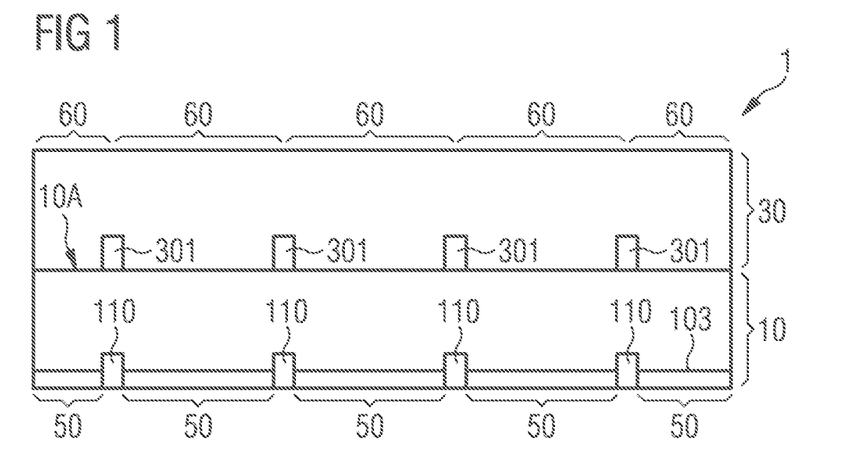
FIG. 1 shows a schematic cross-section through an optoelectronic semiconductor device according to a first exemplary embodiment.

FIG. 1 shows a schematic cross-section through an optoelectronic semiconductor device 1 according to the first exemplary embodiment. The optoelectronic semiconductor device 1 shown here comprises a semiconductor body 10 with an active region 103, preferably having a pn junction. The semiconductor body 10 contains a plurality of emission regions 50, which are separated from each other by several elements of an insulating grid 110. The insulating grid 110 isolates the emission regions from each other, especially electrically. Each emission region 50 can be controlled separately and, for example, represents one pixel of a display unit. The semiconductor body 10 has a coupling-out surface 10A through which at least part of the electromagnetic radiation generated in the active region 103 is coupled out. A wavelength conversion element 30 is arranged downstream of the coupling-out surface 10A.

The wavelength conversion element 30 comprises a plurality of conversion regions 60, each of which is separated from the other by a metallic separator 301. The metallic separators 301 are arranged at the interface of the semiconductor body 10 and the wavelength conversion element 30 and completely embedded in the material of the wavelength conversion element 30. The emission regions 50 are aligned with conversion regions 60, so that a conversion region 60 is assigned to each emission region 50. The metallic separators 301 are formed with a highly reflective metal, such as silver. Due to the metallic separators 301, the crosstalk of adjacent conversion regions 60 due to the scattering of electromagnetic radiation and the waveguide effect is advantageously reduced.

Figure 2:
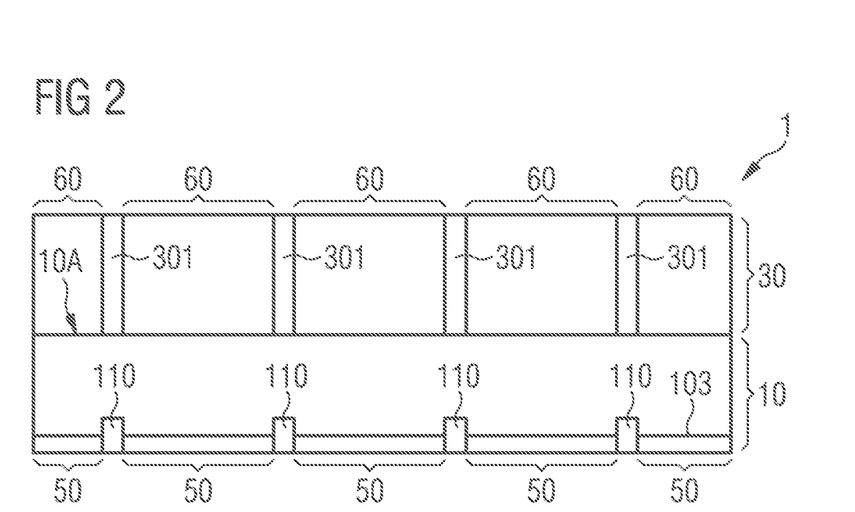
FIG. 2 shows a schematic cross-section through an optoelectronic semiconductor device according to a second exemplary embodiment.

FIG. 2 shows a schematic cross-section through an optoelectronic semiconductor device 1 according to the second exemplary embodiment, which largely corresponds to the first exemplary embodiment. In contrast, the metallic separators 301 extend completely through the wavelength conversion element 30. This embodiment has the advantage that crosstalk within the wavelength conversion element 30 is completely eliminated.

Figure 3:
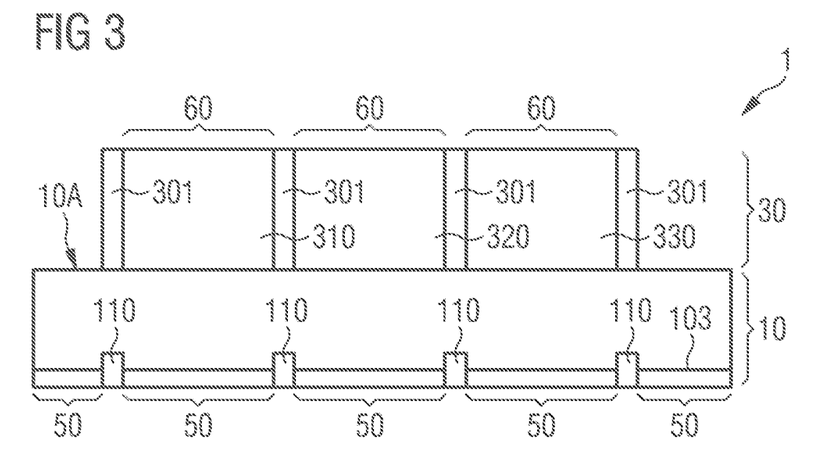
FIG. 3 shows a schematic cross-section through an optoelectronic semiconductor device according to a third exemplary embodiment.

FIG. 3 shows a schematic cross-section through an optoelectronic semiconductor device 1 according to the third exemplary embodiment. In this exemplary embodiment, the conversion regions 60 of the wavelength conversion element 30 are each filled with different conversion materials 310, 320, 330. For example, the first conversion material 310 emits electromagnetic radiation in the green spectral range, the second conversion material 320 emits electromagnetic radiation in the red spectral range and the third conversion material 330 emits electromagnetic radiation in the blue spectral range. The third conversion material 330 can in particular be a transparent filler material, which in particular does not cause any wavelength conversion. For example, the conversion region 60 provided for the third conversion material 330 can also be arranged without filling, for direct emission of the electromagnetic radiation generated in the active range 103. By means of an optoelectronic semiconductor device 1 constructed in this way, an RGB unit can be advantageously produced which is capable of generating different mixed radiation and color impressions for a viewer.

Figure 4A:
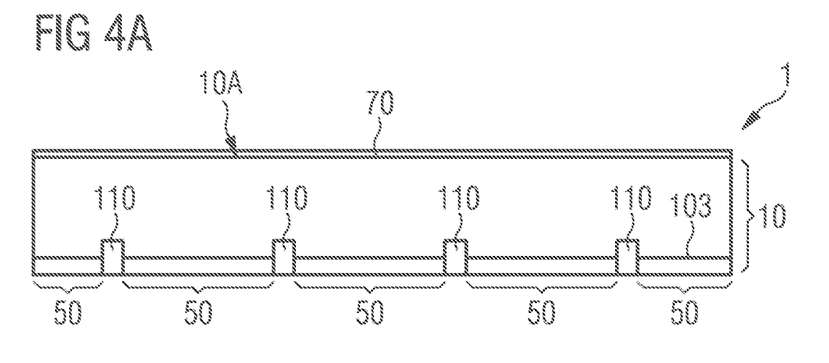
FIGS. 4A to 4H show schematic cross-sections through an optoelectronic semiconductor device according to a fourth exemplary embodiment in different stages of its manufacture.

FIG. 4A shows a schematic cross-section through an optoelectronic semiconductor device 1 according to the fourth exemplary embodiment in a first step of its manufacturing. A semiconductor body 10 with an active region 103 and a plurality of emission regions 50 divided by the elements of an insulating grid 110 is shown. An adhesive layer 70 is applied to the semiconductor body 10 on the side facing the coupling-out surface 10A. The adhesive layer 70 in particular comprises a metal which can be electro-plated and has good adhesion to the material of the semiconductor body 10.

Figure 4B:
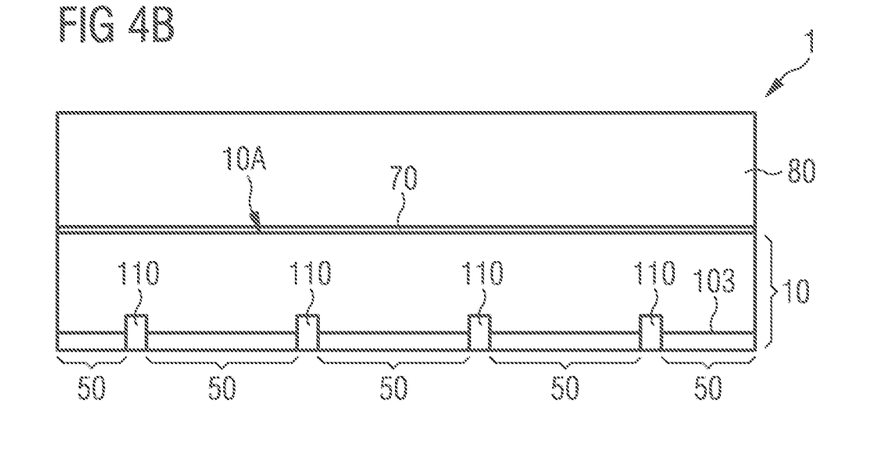

FIG. 4B shows a schematic cross-section through an optoelectronic semiconductor device 1 according to the fourth exemplary embodiment in a further step of its manufacturing. A mask layer 80 is applied to the side of the adhesive layer 70 facing away from the semiconductor body 10. The mask layer 80 in particular comprises a dry resist layer or a photoresist layer. The mask layer 80 can be applied to the adhesive layer 70 by laminating or spin-coating.

Figure 4C:
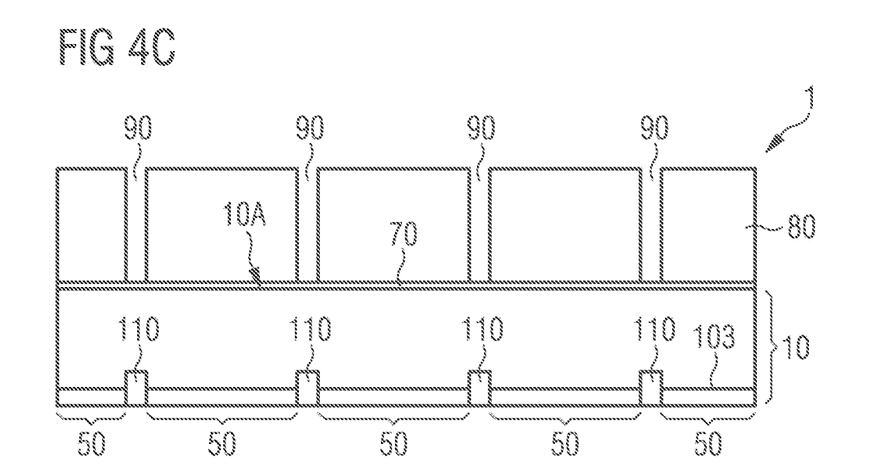

FIG. 4C shows a schematic cross-section through an optoelectronic semiconductor device 1 according to the fourth exemplary embodiment in a further step of its manufacturing. A large number of recesses 90 have been made in the mask layer 80. The recesses 90 extend from the surface of the mask layer 80 facing away from the semiconductor body 10 to the adhesive layer 70 and completely penetrate the mask layer 80. In a direction parallel to the main extension direction of the semiconductor body 10, the recesses 90 are aligned with the metallic separators 110.

Figure 4D:
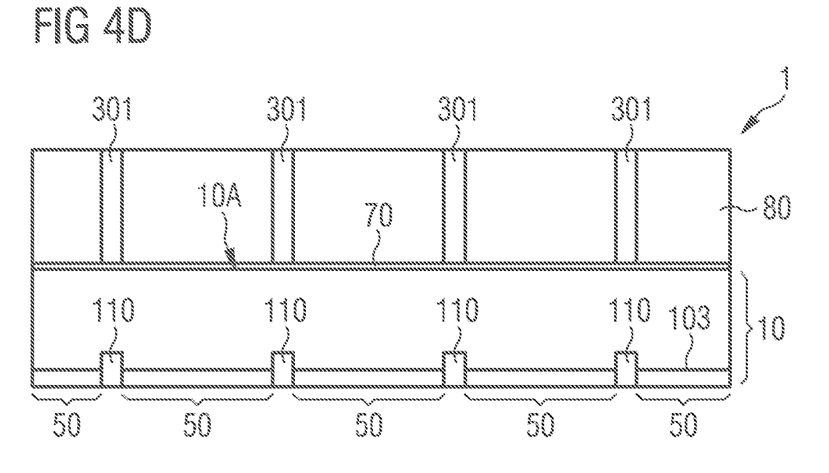

FIG. 4D shows a schematic cross-section through an optoelectronic semiconductor device 1 according to the fourth exemplary embodiment in a further step of its manufacturing. A large number of metallic separators 301 are incorporated in the recesses 90 by means of electro-plating. In the electro-plating process, for example, the adhesive layer 70 can be used as seed layer and simultaneously for electrical contacting for the galvanic process. The metallic separators 301 have a high reflectivity for the electromagnetic radiation generated in the optoelectronic semiconductor device 1.

Figure 4E:
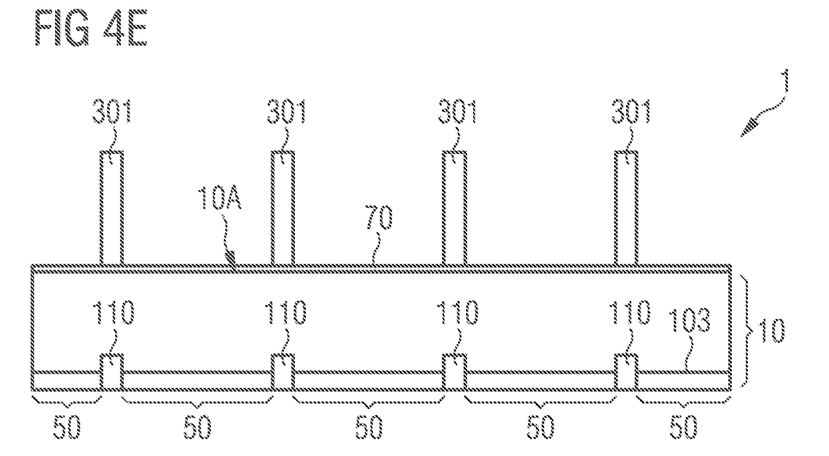

FIG. 4E shows a schematic cross-section through an optoelectronic semiconductor device 1 according to the fourth exemplary embodiment in a further step of its manufacturing. The mask layer 80 is completely removed and the metallic separators 301 are exposed. Especially when using a mask layer 80, which has a poor optical transparency, the complete removal of the mask layer 80 is advantageous.

Figure 4F:
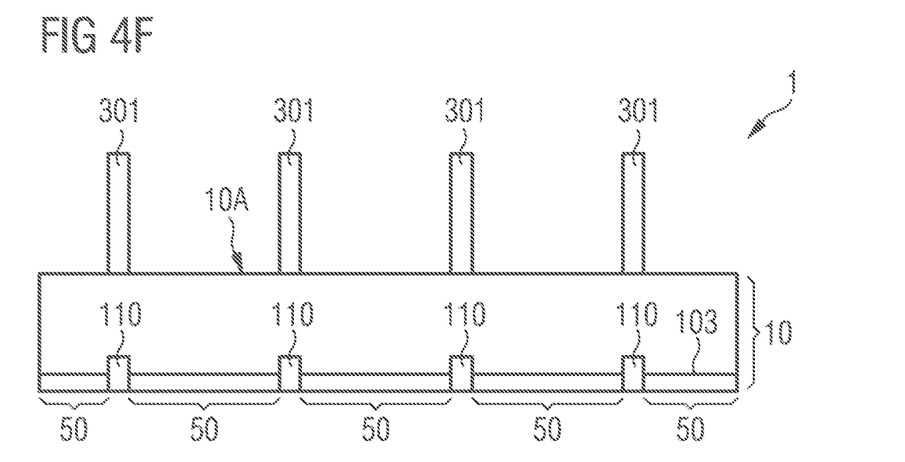

FIG. 4F shows a schematic cross-section through an optoelectronic semiconductor device 1 according to the fourth exemplary embodiment in a further step of its manufacturing. The adhesive layer 70 is completely removed from the semiconductor body 10. The complete removal of the adhesive layer 70 is particularly advantageous when using a metallic adhesive layer 70, which has a poor optical transparency.

Figure 4G:
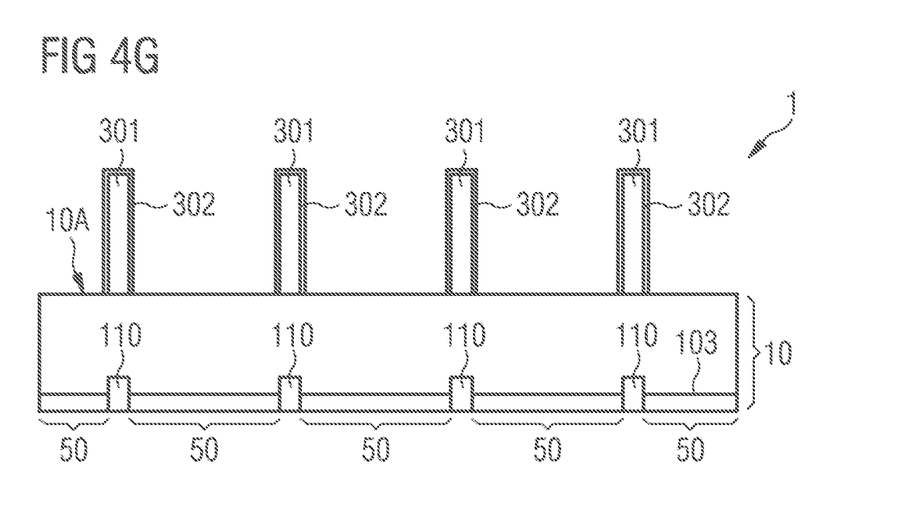

FIG. 4G shows a schematic cross-section through an optoelectronic semiconductor device 1 according to the fourth exemplary embodiment in a further step of its manufacturing. The metallic separators 301 are coated with a reflective layer 302 to improve their optical reflectivity. The reflective layer 302, for example, can be formed with a highly reflective metal such as gold, silver, aluminum, nickel or copper. The reflecting layer 302, for example, is deposited on the metallic separators 301 by means of reductive deposition or an ion exchange process. In particular, the reflective layer 302 is a multilayer structure of dielectric layers with alternating refractive indices for forming a dielectric mirror. In particular, an ALD deposition process can be used to generate dielectric ALD layers for the deposition of dielectric layers.

Figure 4H:
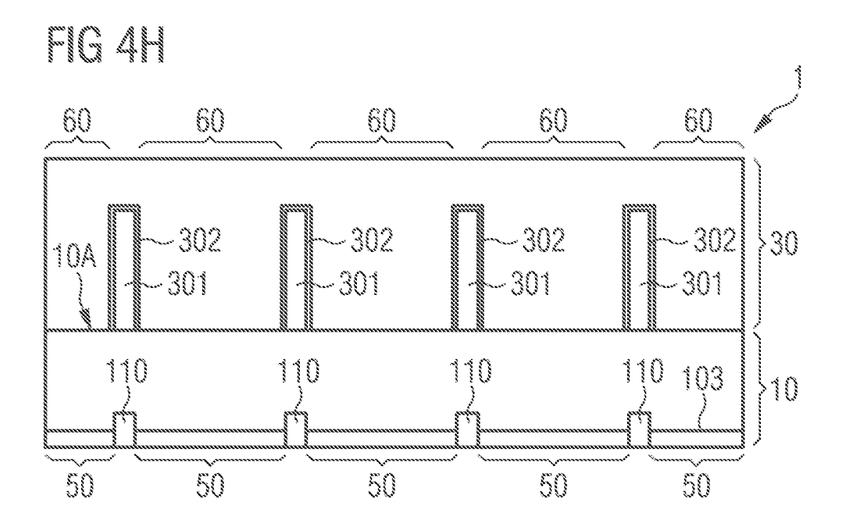

FIG. 4H shows a schematic cross-section through an optoelectronic semiconductor device 1 according to the fourth exemplary embodiment in a further step of its manufacturing. The spaces between the metallic separators 301 are filled with the material of a wavelength conversion element 30. The wavelength conversion element 30 projects above the metallic separators 301, whereby the metallic separators 301 are completely embedded in the wavelength conversion element 30.

The wavelength conversion element 30 can be applied by spraying, jetting, dispensing, doctoring or stamping and can contain a matrix material. A matrix material can, for example, be a polymer, a silicone, an epoxy, a hybrid material or an inorganic sol-gel material. Converter particles that are as small as possible are introduced into the matrix material. This means that the D50 lies in a range from 1 µm to 5 µm. The lateral dimension of a conversion region 60 in this example is 40 µm. The height of the wavelength conversion layer 30 in the main emission direction is equal to 10 µm.

Figure 5:
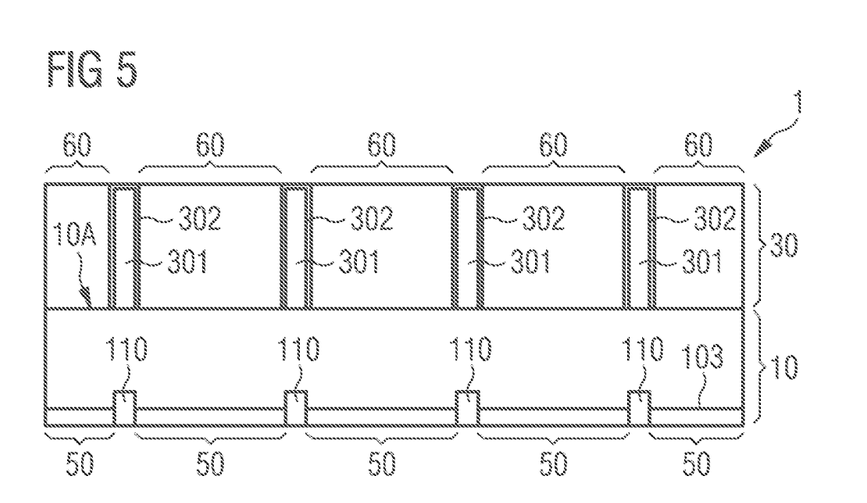
FIG. 5 shows a schematic cross-section through an optoelectronic semiconductor device according to a fifth exemplary embodiment.

FIG. 5 shows a schematic cross-section through an optoelectronic semiconductor device 1 according to the fifth exemplary embodiment. In this exemplary embodiment, the projection of the wavelength conversion element 30 over the metallic separators 301 is removed. In other words, the wavelength conversion element 30 is removed to the level of the metallic separators 301 by etching, polishing, grinding or ultrasonic cleaning. In particular, the ablation rate during the grinding process on the metallic separators 301 is less than or equal to the ablation rate of the wavelength conversion material.

The invention is not limited by the description of the exemplary embodiments. Rather, the invention includes any new feature and any combination of features, which in particular includes any combination of features in the patent claims, even if that feature or combination itself is not explicitly mentioned in the patent claims or exemplary embodiments.

What is claimed is:

1. A method for manufacturing an optoelectronic semiconductor device, the method comprising:
   providing a semiconductor body including an active region configured to generate electromagnetic radiation and a coupling-out surface along a main radiation direction;
   applying an adhesive layer to the semiconductor body on a side facing the coupling-out surface;
   forming a mask layer having a plurality of recesses on the coupling-out surface of the semiconductor body, wherein the recesses extend from a surface of the mask layer facing away from the semiconductor body to the adhesive layer and completely penetrate the mask layer;
   depositing metallic separators in the recesses; and
   applying a wavelength conversion element to the coupling-out surface of the semiconductor body such that the metallic separators are at least partially embedded therein.

2. The method according to claim 1, further comprising removing the adhesive layer after depositing the metallic separators.

3. The method according to claim 1, wherein the recesses are aligned with emission regions of the semiconductor body in a direction transverse to the main radiation direction.

4. The method according to claim 1, wherein the metallic separators form a grid which divides the wavelength conversion element into conversion regions.

5. The method according to claim 1, further comprising removing the mask layer after depositing the metallic separators.

6. The method according to claim 5, wherein depositing the metallic separators comprises galvanically depositing the metallic separators.

7. The method according to claim 1, further comprising electrolessly depositing a reflective layer on the metallic separators.

8. The method according to claim 1, further comprising removing a material of the wavelength conversion element from a side of the metallic separators facing away from the semiconductor body.

9. The method according to claim 1, further comprising forming the wavelength conversion element with an extension in the main radiation direction in a range of 5 µm to 20 µm.

10. The method according to claim 1, further comprising forming a reflective layer on the metallic separators.

11. The method according to claim 1, further comprising forming the metallic separators such that they completely penetrate the wavelength conversion element on a side facing away from the semiconductor body.

12. A method for manufacturing an optoelectronic semiconductor device, the method comprising:
   providing a semiconductor body including an active region configured to generate electromagnetic radiation along a main radiation direction and a coupling-out surface, the semiconductor body comprising a plurality of independently controllable emission regions;
   applying an adhesive layer to the semiconductor body on a side facing the coupling-out surface;
   forming a mask layer having a plurality of recesses on the coupling-out surface of the semiconductor body, wherein the recesses extend from a surface of the mask layer facing away from the semiconductor body to the adhesive layer and completely penetrate the mask layer;
   depositing metallic separators in the recesses; and
   applying a wavelength conversion element to the coupling-out surface of the semiconductor body such that the metallic separators are at least partially embedded therein.

13. The method according to claim 12, further comprising assigning each emission region to exactly one conversion region of the wavelength conversion element.

14. The method according to claim 13, further comprising arranging different converter materials in different conversion regions.

* * * * *